United States Patent
Wang et al.

(10) Patent No.: US 11,417,298 B2
(45) Date of Patent: Aug. 16, 2022

(54) CORRECTION FOR DEFECTIVE MEMORY OF A MEMORY-IN-PIXEL DISPLAY

(71) Applicant: Apple Inc., Cupertino, CA (US)

(72) Inventors: Stanley Bo-Ting Wang, Cupertino, CA (US); Derek Keith Shaeffer, Redwood City, CA (US); Ivan Knez, San Jose, CA (US); Jose Antonio Dominguez-Caballero, San Jose, CA (US); Tien-Chien Kuo, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/224,939

(22) Filed: Apr. 7, 2021

(65) Prior Publication Data

US 2021/0225334 A1    Jul. 22, 2021

Related U.S. Application Data

(63) Continuation of application No. 16/502,848, filed on Jul. 3, 2019, now Pat. No. 10,978,028.

(Continued)

(51) Int. Cl.
*G09G 5/399*    (2006.01)
*G09G 5/393*    (2006.01)
(Continued)

(52) U.S. Cl.
CPC .............. *G09G 5/399* (2013.01); *G09G 3/32* (2013.01); *G09G 5/393* (2013.01); *G09G 5/395* (2013.01);
(Continued)

(58) Field of Classification Search
CPC ........ G09G 5/399; G09G 5/393; G09G 5/395; G09G 3/32; G09G 3/3233; G09G 3/2014;
(Continued)

(56) References Cited

U.S. PATENT DOCUMENTS 6,313,814 B1    11/2001  Arimoto et al.
7,230,600 B1 *   6/2007  Huang ................. G11C 29/846
                                                          345/686

(Continued)

FOREIGN PATENT DOCUMENTS

EP          1207512 A1    5/2002
JP       2000105572 A     4/2000
(Continued)

OTHER PUBLICATIONS

Notice of Allowance for Korean Patent Application No. 10-2021-7007697 dated Sep. 3, 2021; 2 pgs.

(Continued)

*Primary Examiner* — Brent D Castiaux
(74) *Attorney, Agent, or Firm* — Fletcher Yoder, P.C.

(57) ABSTRACT

An electronic display may include a pixel circuit. The pixel circuit may include memory storage to store data values representative of image data to be depicted via the pixel circuit. The memory storage may also include memory components for storing bits of the data value. The pixel circuit may also include a light-emitting device for emitting light based at least in part on the data value and a controller. The controller may receive the data value and store the bits based on a mapping between the bits and the memory components. The mapping may be determined based on routing one or more of the bits associated with one or more defective memory components of the memory components to one or more other memory components of the memory components. The controller may also drive the light-emitting device to emit light based on the bits stored in accordance with the mapping.

20 Claims, 11 Drawing Sheets

Related U.S. Application Data

(60) Provisional application No. 62/732,321, filed on Sep. 17, 2018.

(51) Int. Cl.
*G09G 3/32* (2016.01)
*G09G 5/395* (2006.01)

(52) U.S. Cl.
CPC .......... *G09G 2320/064* (2013.01); *G09G 2320/0646* (2013.01); *G09G 2330/08* (2013.01); *G09G 2330/12* (2013.01)

(58) Field of Classification Search
CPC ........... G09G 3/20; G09G 2320/064; G09G 2320/0646; G09G 2330/08; G09G 2330/12; G09G 2300/0857; G11C 29/70; G11C 29/76
See application file for complete search history.

(56) References Cited

U.S. PATENT DOCUMENTS

| | | |
|---|---|---|
| 8,379,034 B2 | 2/2013 | Hwang et al. |
| 8,421,726 B2 | 4/2013 | Moriya et al. |
| 2002/0000966 A1* | 1/2002 | Kudo .................. G09G 3/3655 345/87 |
| 2002/0030670 A1 | 3/2002 | Matsueda |
| 2008/0055324 A1* | 3/2008 | Kodaira .............. G11C 29/806 345/530 |
| 2008/0062158 A1 | 3/2008 | Willis |
| 2012/0075320 A1 | 3/2012 | Handschy et al. |
| 2015/0229919 A1 | 8/2015 | Weber et al. |

FOREIGN PATENT DOCUMENTS

| | | |
|---|---|---|
| JP | 2000105572 A1 | 4/2000 |
| JP | 2002-278499 A | 9/2002 |
| JP | 2008058440 A | 3/2008 |
| JP | 2009-110006 A | 5/2009 |
| JP | 2015534097 A | 11/2015 |
| KR | 20050020837 A | 3/2005 |
| KR | 20090126786 A | 12/2009 |

OTHER PUBLICATIONS

Office Action for Japanese Patent Application No. 2021-514013 dated Apr. 11, 2022; 2 pgs.

\* cited by examiner

CORRECTION FOR DEFECTIVE MEMORY OF A MEMORY-IN-PIXEL DISPLAY

CROSS-REFERENCE TO RELATED APPLICATIONS

This application is a continuation of and claims priority to U.S. application Ser. No. 16/502,848, filed Jul. 3, 2019, entitled "Correction for Defective Memory of a Memory-In-Pixel Display," which claims the benefit of U.S. Provisional Application No. 62/732,321, entitled "Correction Techniques for Defective Memory of a Memory-in-Pixel Display," filed on Sep. 17, 2018, which are both incorporated herein by reference in their entirety for all purposes.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Methods and systems for reducing visual artifacts caused by defective memory circuitry of a memory-in-pixel electronic display may provide immense value. The techniques described herein may provide for various rerouting schemes to adjust how image data is stored in the memory of the memory-in-pixel electronic display before being used to drive a pixel to emit light. That is, image data may initially be stored as data values in memory-in-pixels prior to being used to drive the respective pixels. With this in mind, in response to a memory component of a memory-in-pixel being inaccessible (e.g., defective), other memory circuitry may be used to reduce the effects of the defective memory component. For example, the memory component corresponding to the defective memory circuitry may be replaced by another memory component, such as a back-up memory component of the memory-in-pixel, and the image data may be rerouted to the respective pixel via the replacement memory component.

In some cases, pixel data may be stored in memory components as respective bits of data. In this way, one bit may be stored per memory component. Since each memory component stores one bit, when any of the memory components are defective, the replacement memory component may act as substitute bit storage for the defective memory component without observable loss of performance. For example, the memory component for the least significant bit of a pixel may be mapped to the defective memory component to replace the defective memory component, and thus reduce the effects of the defective memory component. In other embodiments, a spare memory component may be used to replace a defective memory component, thereby reducing the appearance of visual artifacts due to the inability of the pixel to display image data via the defective memory component.

As such, this disclosure describes an electronic display having one or more pixels that include memory, or a memory-in-pixel electronic display, and techniques for rerouting image data for the one or more pixels based on defective memory of the electronic display. The inclusion of the rerouting may enable usage of the memory-in-pixel electronic display even while defective memory remains within the memory-in-pixel electronic display. In this way, the rerouting may reduce or eliminate visual artifacts caused by defective memory of the memory-in-pixel electronic display.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
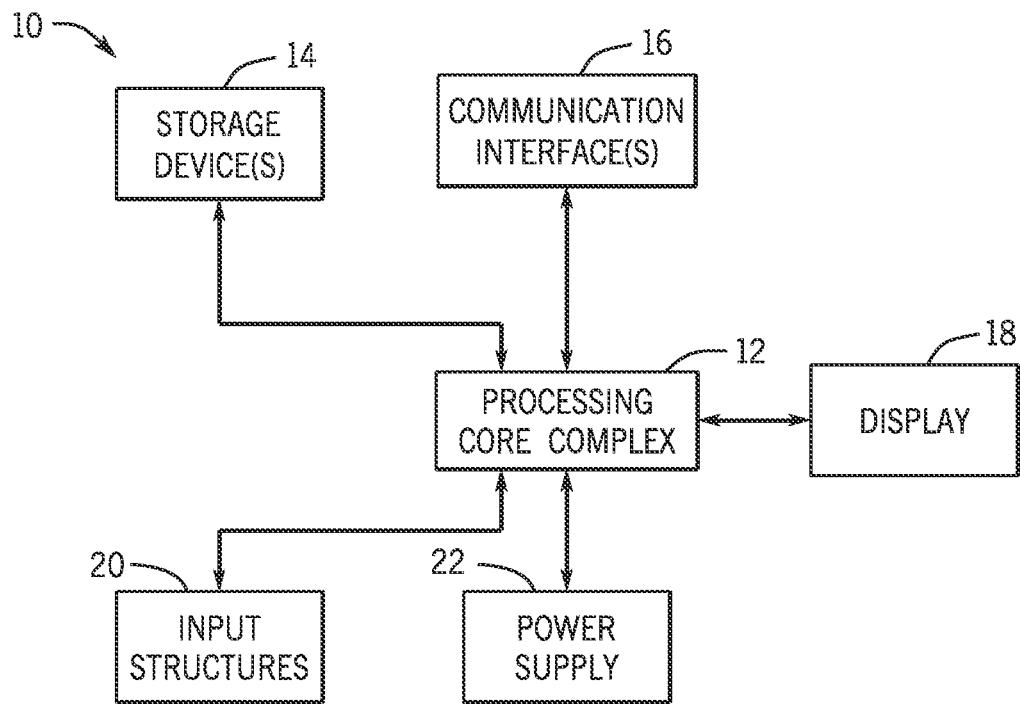
FIG. 1 is a schematic block diagram of an electronic device, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure relates generally to techniques for implementing memory in pixels of an electronic display and, more specifically, correction techniques for defective memory circuitry. Electronic displays are found in numerous electronic devices, from mobile phones to computers, televisions, automobile dashboards, and many more. Electronic displays have achieved increasingly higher resolutions by reducing individual pixel size, but these increasing resolutions may increase a bandwidth used to communicate image data from the processing circuitry to a pixel array for presentation of the image, since more image data is used to communicate the same image at a higher electronic display resolution.

To correct for this, memory may be included in electronic display, such as in pixels of the electronic display, and may enable the electronic display to reduce its reliance on a frame buffer to store image data to be depicted via the pixels. Having memory in the pixels may lessen the design complexity of electronic displays, as well, because the less image data that is concurrently transmitted to a pixel array of an electronic display, the simpler an electronic display may be designed. However, the use of memory-in-pixels may increase the risk of perceivable visual artifacts due to the memory components of certain pixels becoming defective, corrupted, or inaccessible. Thus, embodiments of the present disclosure relate to correction techniques for minimizing the impact of defective memory circuitry of a memory-in-pixel electronic display.

A memory-in-pixel electronic display may include multiple pixels and multiple memory circuits to temporarily store image data before using the image data to drive the pixels. Including memory in the pixels may reduce transmission bandwidths of image data to pixel arrays for display because the pixel may store image data in the respective memory. In this way, a reliance on frame buffers to temporarily store the image data external to the pixel is reduced because the pixel has its own memory to store its own image data prior to display of the image data.

Memory may be implemented in pixel circuitry that includes a light-emitting diode (LED). An organic light-emitting diode (OLED) represents one type of light-emitting device that may be found in the pixel, but other types of LEDs or other light-emitting or modulating components may be used in the pixel circuitry as a light-emitting device, such as components to support liquid crystal displays (LCDs), plasma display panels, dot-matrix displays, or the like.

A general description of suitable electronic devices that may include a memory-in-pixel electronic display that uses rerouting techniques to work around any defective memory circuitry and that displays images through emission of light from light-emitting components, such as a LED (e.g., an OLED) display, or through emission of light from light-modulating components, such as liquid-crystal on silicon (LCOS) devices or digital micro-mirror (DMD) devices, and corresponding circuitry are provided in this disclosure. It should be understood that a variety of electronic devices, electronic displays, and electronic display technologies may be used to implement the techniques described here. One example of a suitable electronic device is shown in FIG. 1 (e.g., electronic device 10) and may include, among other things, processor(s) such as a processing core complex 12, storage device(s) 14, communication interface(s) 16, an electronic display 18, input structures 20, and a power supply 22. The blocks shown in FIG. 1 may each represent hardware, software, or a combination of both hardware and software. The electronic device 10 may include more or fewer elements. It should be appreciated that FIG. 1 merely provides one example of a particular implementation of the electronic device 10.

The processing core complex 12 of the electronic device 10 may perform various data processing operations, including generating and processing image data for display on the electronic display 18, in combination with the storage device (s) 14. For example, instructions that are executed by the processing core complex 12 may be stored on the storage device(s) 14. The storage device(s) 14 may include volatile memory, non-volatile memory, or a combination thereof. By way of example, the storage device(s) 14 may include random-access memory, read-only memory, flash memory, a hard drive, and so forth.

The electronic device 10 may use the communication interface(s) 16 to communicate with various other electronic devices or elements. The communication interface(s) 16 may include input/output (I/O) interfaces and/or network interfaces. Such network interfaces may include those for a personal area network (PAN) such as Bluetooth, a local area network (LAN) or wireless local area network (WLAN) such as Wi-Fi, and/or for a wide area network (WAN), such as a cellular network.

Using pixels containing light-emitting components (e.g., LEDs, OLEDs), the electronic display 18 may show images generated by the processing core complex 12. The electronic display 18 may include touchscreen functionality for users to interact with a user interface appearing on the electronic display 18. Input structures 20 may also enable a user to interact with the electronic device 10. In some examples, the input structures 20 may represent hardware buttons, which may include volume buttons or a hardware keypad. The power supply 22 may include any suitable source of power for the electronic device 10. This may include a battery within the electronic device 10 and/or a power conversion device to accept alternating current (AC) power from a power outlet.

Figure 2:
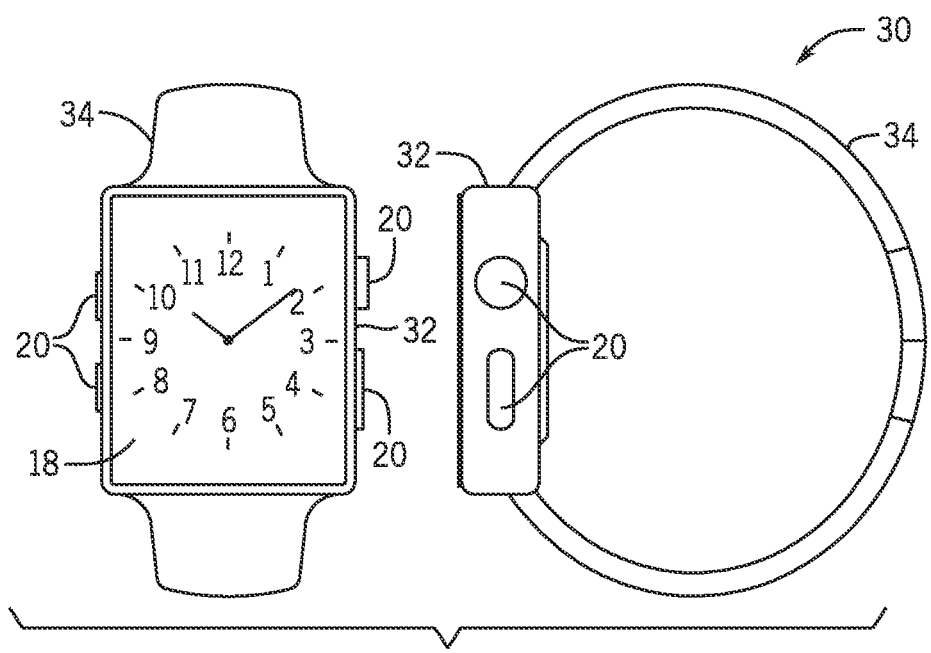
FIG. 2 is a perspective view of a fitness band representing an embodiment of the electronic device of FIG. 1, in accordance with an embodiment.

As may be appreciated, the electronic device 10 may take a number of different forms. As shown in FIG. 2, the electronic device 10 may take the form of a watch 30. For illustrative purposes, the watch 30 may be any Apple Watch® model available from Apple Inc. The watch 30 may include an enclosure 32 that houses the electronic device 10 elements of the watch 30. A strap 34 may enable the watch 30 to be worn on the arm or wrist. The electronic display 18 may display information related to the watch 30 operation, such as the time. Input structures 20 may enable a person wearing the watch 30 to navigate a graphical user interface (GUI) on the electronic display 18.

Figure 3:
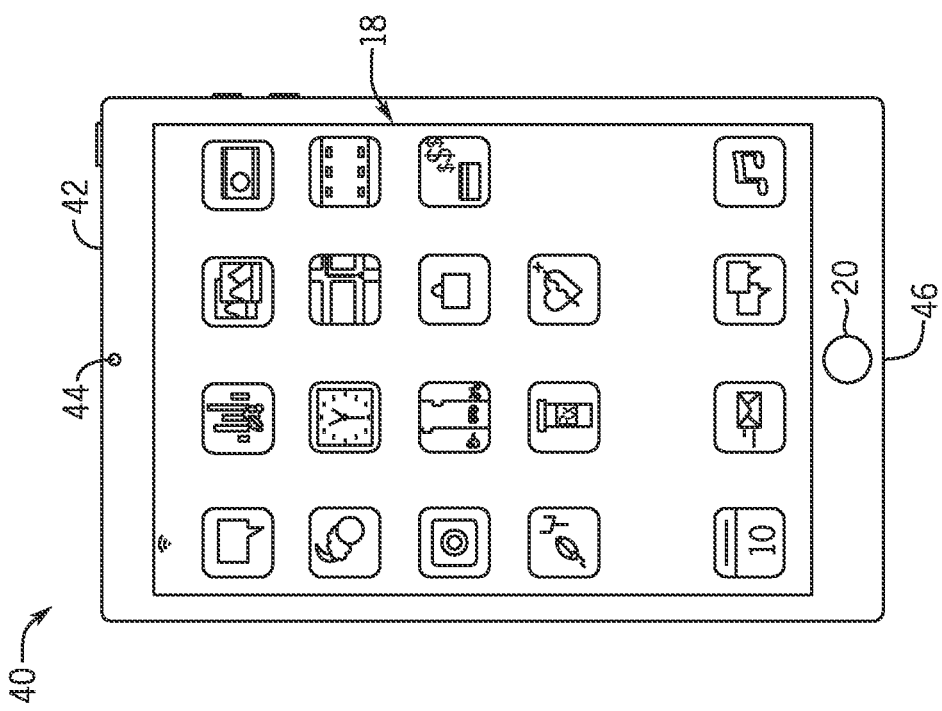
FIG. 3 is a front view of a slate representing an embodiment of the electronic device of FIG. 1, in accordance with an embodiment.

The electronic device 10 may also take the form of a tablet device 40, as is shown in FIG. 3. For illustrative purposes, the tablet device 40 may be any iPad® model available from Apple Inc. Depending on the size of the tablet device 40, the tablet device 40 may serve as a handheld device such as a mobile phone. The tablet device 40 includes an enclosure 42 through which input structures 20 may protrude. In certain examples, the input structures 20 may include a hardware keypad (not shown). The enclosure 42 also holds the electronic display 18. The input structures 20 may enable a user to interact with a GUI of the tablet device 40. For example, the input structures 20 may enable a user to type Short Message Service (SMS) text messages, Rich Communications Service (RCS) text messages, or make a telephone call. A speaker 44 may output a received audio signal and a microphone 46 may capture the voice of the user. The tablet device 40 may also include a communication interface 16 to enable the tablet device 40 to connect via a wired connection to another electronic device.

Figure 4:
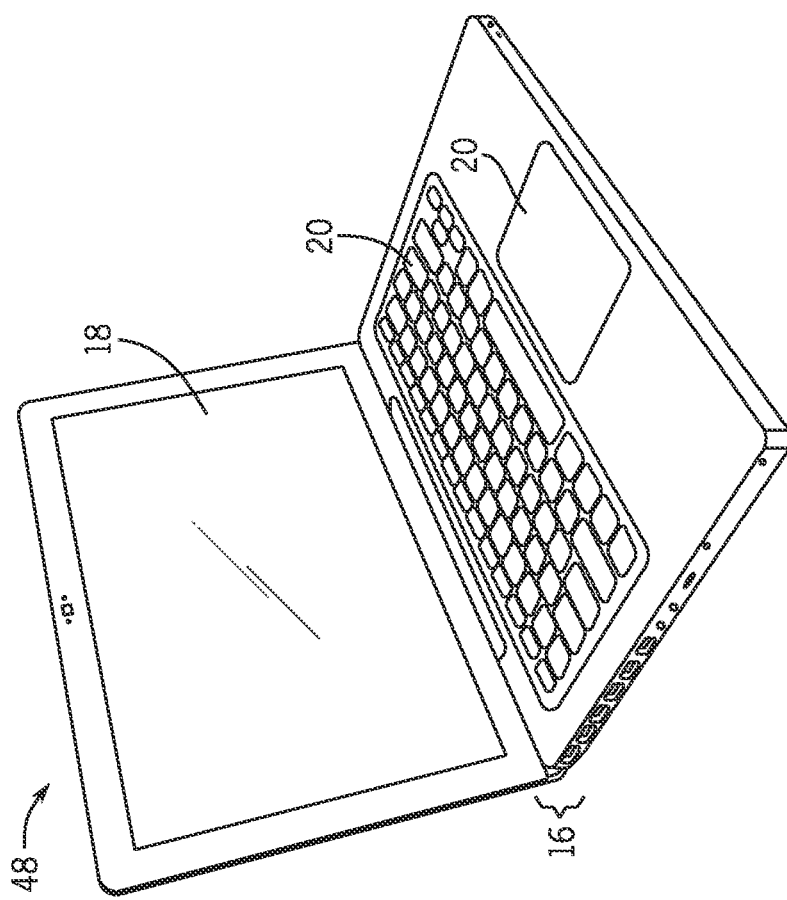
FIG. 4 is a front view of a notebook computer representing an embodiment of the electronic device of FIG. 1, in accordance with an embodiment.

A computer 48 represents another form that the electronic device 10 may take. For illustrative purposes, the tablet device 40 may be any MacBook® model available from Apple Inc. It should be appreciated that the electronic device 10 may also take the form of any other computer, including a desktop computer. The computer 48 shown in FIG. 4 includes the electronic display 18 and input structures 20 that include a keyboard and a track pad. Communication interfaces 16 of the computer 48 may include, for example, a universal service bus (USB) connection.

In any case, as described above, operating an electronic device 10 to communicate information by displaying images on its electronic display 18 generally consumes electrical power. Additionally, as described above, electronic devices 10 often store a finite amount of electrical energy. Thus, to facilitate improving power consumption efficiency, an electronic device 10, in some embodiments, may include an electronic display 18 that implements memory-in-pixel as a way to reduce, or eliminate, use of an external frame buffer in displaying images, and thus reducing power consumed by use of the frame buffer in displaying images and/or reducing a bandwidth of image data being received into the electronic display 18. In some cases, an internal frame buffer (e.g., located in the electronic display 18, such as in a display driver integrated circuit of the electronic display 18) may be used in lieu of or in addition to memory-in-pixel techniques. By implementing memory-in-pixel or related techniques, an electronic display 18 may be programmed with smaller bandwidths of image data, further enabling power consumption savings. In addition, an electronic display 18 using memory in the pixel or in an onboard frame buffer may have a less complex design than an electronic display 18 without memory in the pixel or without an onboard frame buffer. These benefits may be realized because a pixel retains data transmitted to its memory until new image data is written to the memory.

Similarly, portions of image data may program a subset of pixels associated with the electronic display 18. An image to be displayed is typically converted into numerical data, or image data, so that the image is interpretable by components of the electronic display 18. In this way, image data itself may be divided into small "pixel" portions, each of which may correspond to a pixel portion of the electronic display 18, or of a display panel corresponding to the electronic display 18. In some embodiments, image data is represented through combinations of red-green-blue light such that one pixel appearing to have a single color is really three sub-pixels respectively emitting a proportion of red, green, and blue light to create the single color. In this way, numerical values, or image data, that quantify the combinations of red-green-blue light may correspond to a digital luminance level, or a gray level, that associates a luminance intensity (e.g., a brightness) of a color of the image data for those particular sub-pixels.

As will be appreciated, the number of gray levels in an image usually depends on a number of bits used to represent the gray levels in a particular electronic display 18, which may be expressed as $2^N$ gray levels where N corresponds to the number of bits used to represent the gray levels. By way of example, in an embodiment where an electronic display 18 uses 8 bits to represent gray levels, the gray level ranges from 0, for black or no light, to 255, for maximum light and/or full light, for a total of 256 potential gray levels. Similarly, an electronic display 18 using 6 bits may use 64 gray levels to represent a luminance intensity for each sub-pixel.

Having memory in the pixels of an electronic display 18 enables image data to transmit to sub-pixels associated with one color without image data having to transmit to additional sub-pixels associated with a second color at the same time. For the purposes of this disclosure, sub-pixels are discussed in terms of red-green-blue color channels, where a color channel is a layer of image data including gray levels for a single color where, when combined with additional color channels, creates an image of a true, or desired, color, and where the image data for a color channel corresponds to image data transmitted to a sub-pixel for the color channel. However, it should be understood that any combination of color channels and/or sub-pixels may be used, such as, blue-green-red, cyan-magenta-yellow, and/or cyan-magenta-yellow-black.

Figure 5:
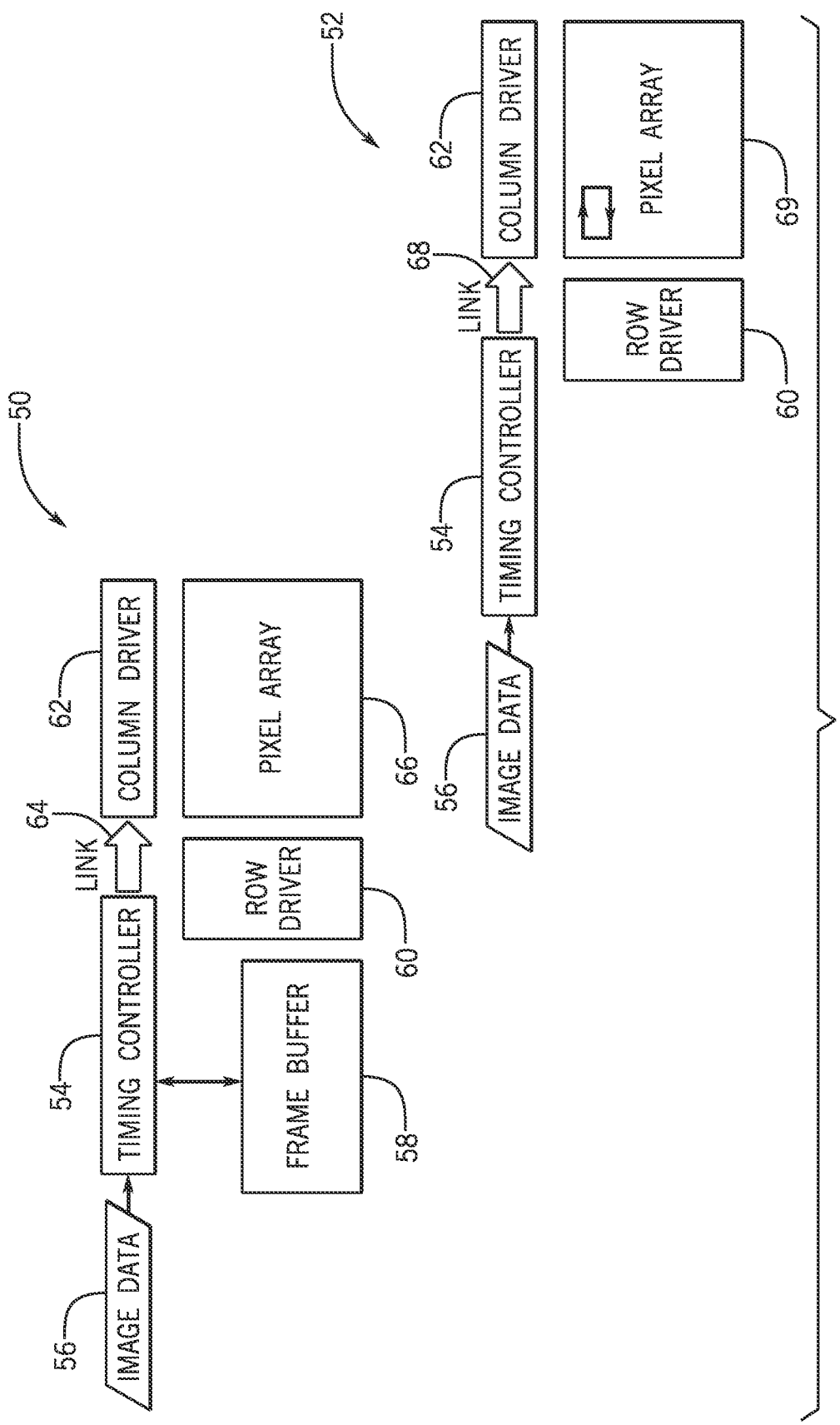
FIG. 5 is a block diagram of a display system of the electronic device of FIG. 1, in accordance with an embodiment.

FIG. 5 is a block diagram of a display system 50 associated with an electronic display 18 that does not implement memory-in-pixel and a display system 52 associated with an electronic display 18 that does implement memory-in-pixel, which may each respectively be implemented in an electronic device 10. The display system 50 includes a timing controller 54 to receive image data 56, a frame buffer 58, a row driver 60 and a column driver 62 communicatively coupled through communicative link 64 to the timing controller 54, and a pixel array 66 that receives control signals from the column driver 62 and the row driver 60 to create an image on an electronic display 18. Furthermore, the display system 52 includes a timing controller 54 to receive the image data 56, a row driver 60 and a column driver 62 communicatively coupled through a communicative link 68 to the timing controller 54, and a pixel array 69 implementing memory-in-pixel techniques that receives control signals from the column driver 62 and the row driver 60 to create an image on an electronic display 18.

In preparing to display an image, the display system 50 may receive the image data 56 at the timing controller 54. The timing controller 54 may receive and use the image data 56 to determine clock signals and control signals to control a provision of the image data 56 to the pixel array 66 through the column driver 62 and the row driver 60. Additionally or alternatively, in some embodiments, the image data 56 is received by the frame buffer 58.

In either case, the frame buffer 58 may serve as external storage for the timing controller 54 to store the image data 56 prior to output to the column driver 62 and/or the row driver 60. The timing controller 54 may transmit the image data 56 from the frame buffer 58 to the column driver 62 and/or the row driver 60 through the communicative link 64.

In some embodiments, the communicative link 64 is large enough (e.g., determined through transmission bandwidth of image data) to simultaneously transmit image data 56 associated with all the channels to the row driver 60 and/or the column driver 62, for example, the image data 56 associated with a red channel, a green channel, and a blue channel. In this way, the communicative link 64 communicates the image data 56 associated with a respective pixel of the pixel array 66 for the red channel, the green channel, and the blue channel. The column driver 62 and the row driver 60 may transmit control signals based on the image data 56 to the pixel array 66. In response to the control signals, the pixel array 66 emits light at varying luminosities or brightness levels, as indicated through gray levels (e.g., 0 to 255) to communicate an image.

The display system 52 receives the image data 56 at the timing controller 54. The timing controller 54 may use the image data 56 to determine clock signals used to provision the image data 56 to the memory-in-pixel pixel array 69. The timing controller 54 transmits the image data 56 to the row driver 60 and/or the column driver 62 to program the memory of the pixel array 69 with digital data signals associated with the image data 56, where the digital data signals indicate the emission brightness/gray level for the pixels of the pixel array 69.

By implementing memory-in-pixel systems and methods, power consumption of the electronic device 10 may decrease because memory-in-pixel techniques may enable storing and retrieving of data in the frame buffer 58 to be bypassed. In some embodiments, power consumption may be further reduced because memory-in-pixel circuitry may retain data that does not change between presented images, thus reducing an overall number of pixel data loading cycles.

Figure 6:
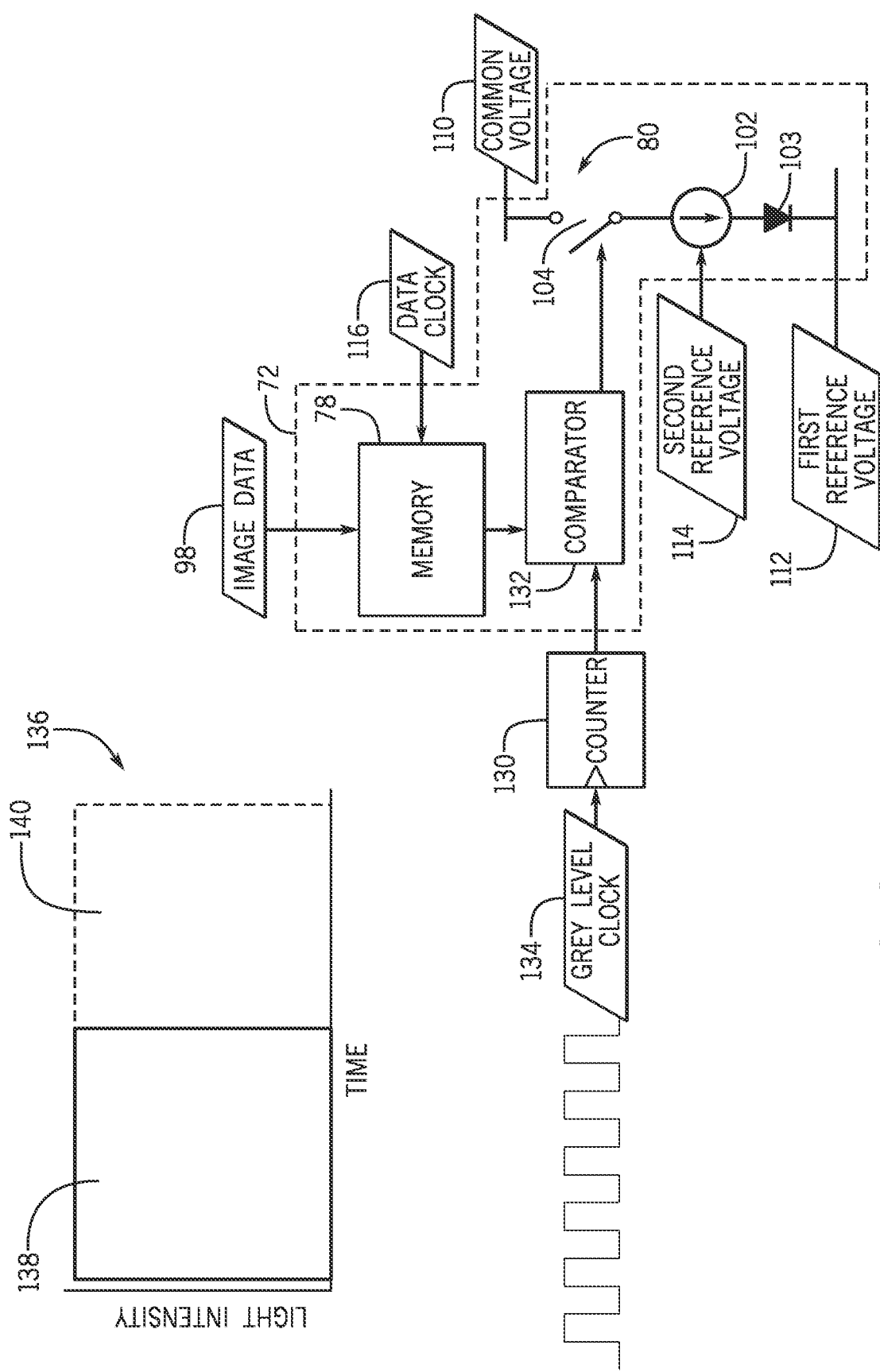
FIG. 6 is a block diagram of an embodiment of a pixel of the display system FIG. 5 that emits light according to a pulse width emission scheme, in accordance with an embodiment.

FIG. 6 is a block diagram of an example of a sub-pixel 72 including a memory 78, a driver 80, a current source 102, a LED 103, a switch 104 (e.g., switching circuitry), and a comparator 132 (e.g., comparing circuitry) and a counter 130 (e.g., counting circuitry). The driver 80 may include the current source 102 and the switch 104. The sub-pixel 72 receives a variety of signals including image data 98, a gray level clock 134, a common voltage 110, a first reference voltage 112, a second reference voltage 114, and a data clock 116 from circuitry external to the sub-pixel 72. It should be appreciated that the depicted sub-pixel 72 is merely intended to be illustrative and not limiting. For example, the memory 78 is described herein as an 8-bit register, but it should be understood that any suitable memory circuit may be used to store any suitable number of bits. It should also be understood that components such as the switch 104, the counter 130, and/or the comparator 132 may take a variety of suitable forms that provide a similar or same function described herein. In some embodiments, the timing controller 54 or other suitable controller circuitry that performs the methods described herein may be part of the sub-pixel 72.

The depicted sub-pixel 72 may emit according to a pulse width emission scheme. Image data 98 transmits to the memory 78, for example, from a column driver 62, for storage. Additionally or alternatively, image data 98, image data 56, or any suitable image data may be transmitted to the memory 78 for storage. In some embodiments, the image data 98 may be clocked into the memory 78 by the data clock 116, for example, on a rising edge of the data clock 116. The image data 98 communicated to the sub-pixel 72 may correspond to a desired gray level at which the respective sub-pixel 72 is to emit light.

Using the image data 98 stored in the memory 78, the comparator 132 determines if a current number represented by a sequence of bits generated by the counter 130 is less than or equal to the image data 98 in memory 78. In other words, the counter 130 counts up to the number indicated by the image data 98 (e.g., numerical gray level) and, in response to the number represented by the counter 130 meeting a condition (e.g., smaller than or equal to the number indicated by the image data 98), the comparator 132 outputs a control signal (MTCH) to close the switch 104. When the condition is not met, the comparator 132 does not output a control signal and opens the switch 104. Additionally or alternatively, the comparator 132 may enable a deactivation control signal to cause the opening of the switch 104. For instance, if the memory 78 stores a binary sequence of 10110101 corresponding to the number 181, the comparator 132 may check if the counter 130 has counted to the number 181, and when the counter 130 exceeds the number 181, the comparator 132 transmits a control signal (MTCH) to open the switch 104 thus preventing the LED 103 from emitting light.

When the switch 104 closes, an electrical connection is created between the common voltage 110 and the first reference voltage 112. This causes current from current source 102 to transmit through the LED 103 causing light to emit from the sub-pixel 72. Thus, emission periods of the sub-pixel 72 may be varied to control a perceived light emitted from the sub-pixel 72 through changing a number indicated by the image data 98. Additionally or alternatively, in some embodiments, the second reference voltage 114 is included to alter an overall current value used to control light emitted from the LED 103. For instance, the second reference voltage 114 may increase a sensitivity of the LED 103 to current changes, such that a lower current value may be used to cause light to emit from the LED 103.

The counter 130 counts from a minimum value to a maximum value, and increments through the range based on a gray level clock 134. Periods of the gray level clock 134 thus may cause the time difference between increments of the gray level. The sub-pixel 72 may follow a pulse width emission scheme. A representation of an emission of light from a sub-pixel 72 following a pulse width emission scheme is shown in graph 136. The graph 136 includes an actual emission period 138 and a total emission period 140, where the duration of the actual emission period 138 may be based on the value of the image data 98 from the counter 130. The total emission period 140 corresponds to a total length of emission and thus a maximum brightness of light that may emit from the sub-pixel 72. The comparator 132 permits light emission for the duration of the actual emission period 138 and in this way, a sub-pixel 72 may emit light of varying perceived brightness.

Figure 7:
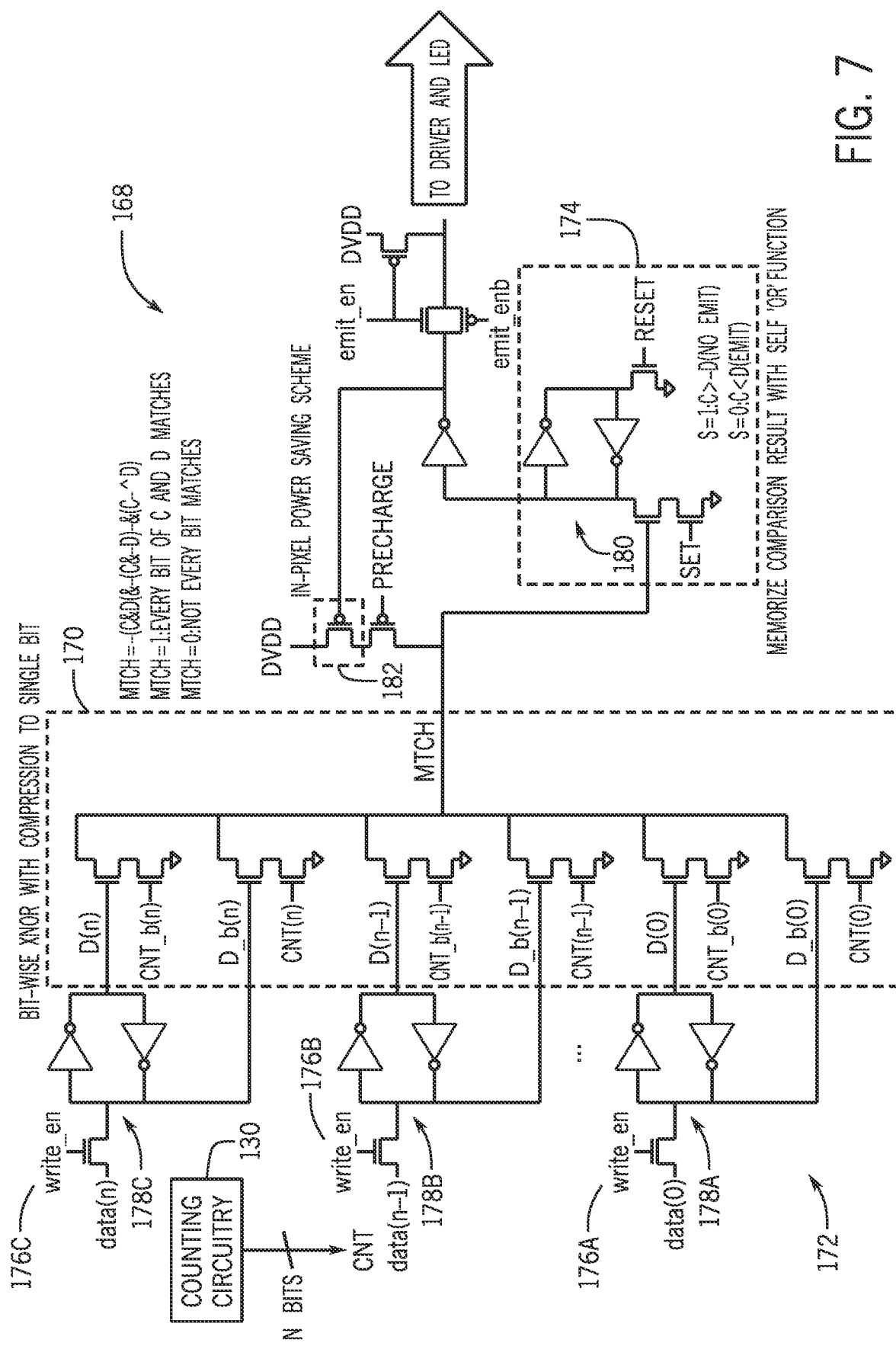
FIG. 7 is a circuit diagram of an example memory circuitry of FIG. 6, in accordance with an embodiment.

As described in FIG. 6, using memory-in-pixel techniques and a comparator may enable a row driver to create a pulse width emission scheme. FIG. 7 is a block diagram of a portion 168 an embodiment of a sub-pixel 72 including a comparator 170, memory circuitry 172, and memory circuitry 174. It should be appreciated that the sub-pixel 72 is intended to be illustrative and not limiting. For example, while the memory circuitry 174 is shown as being coupled to LED driver circuitry and to light-emitting circuitry of the sub-pixel 72, the memory circuitry 174 may couple to any suitable light-emitting circuitry and/or driving circuitry.

In the depicted sub-pixel 72, image data (data) of size N bits (e.g., image data 98) is received into the memory circuitry 172 following a similar process as described earlier. That is, a row driver 60 operates to enable a respective control signal (write_en) to activate a respective transistor 176 to transmit the image data into the bit-stores 178. As depicted, the bit-stores 178 are inverter pairs that are used in a memory cell (e.g., a static random access memory (SRAM) cell) for latching a transmitted voltage value indicative of a bit value (where a group of these bits represents a gray level) until a next voltage value is transmitted for latching (e.g., storage). However, it should be understood that a variety of components may be used to store a voltage indicative of a bit.

In some embodiments, the row driver 60 operates in tandem with a column driver 62 to cause parallel transmission of all bits associated with the image data into the bit-stores 178 by simultaneously activating one or more of the transistors 176. Additionally or alternatively, the row driver 60 may cause bitwise transmission of the image data through selectively activating each transistor 176, for example, loading a bit into bit-store 178A by selectively activating the transistor 176A to cause transmission of the least significant bit of the image data.

After the bits of the gray level corresponding to the image data are stored in the bit-stores 178, the comparator 170 compares the stored bits with bits transmitted from a counter 130. As a reminder, in the pulse width emission scheme, the counter 130, increments up to a maximum gray level, such as on the rising edge of a gray level clock 134, and light emission occurs from the sub-pixel 72 until the counter 130 counts up to a number (e.g., represented by bits outputted from the counter 130) equaling and/or exceeding a number represented by the stored bit of the image data. The comparator 170 may thus perform a compression of all of the received bits into a single bit indicative of whether the stored gray level equals the count transmitted from the counter 130. In this way, the comparator 170 performs a bitwise XNOR compression to a single bit, where an output from the comparator 170 is a logical low (e.g., "0") value unless every bit matches. If every bit matches, the comparator 170 outputs a logical high value. The output from the comparator 170 is stored in memory circuitry 174, where the value is retained in a bit-store 180 until the row driver 60 causes the output of the comparator 170 to transmit to the driver and light-emitting circuitry (e.g., LED, OLED) to drive light emission as previously described. The row driver 60 may activate two transistors with control signals (emit_en and emit_enb) to transmit the output stored in the bit-store 180. It is noted that CNT_b[X] may correspond to an inverse of the CNT[X] and emit_enb corresponds to an inverse of emit_en.

It should be appreciated that in some embodiments the counter 130 may decrement, a comparator 170 may output a logical low value if every bit matches, or any combination thereof. In other words, a variety of valid embodiments may apply described memory-in-pixel techniques. Furthermore, an optional transistor 182 may be included in the portion 168 of the sub-pixel 72 to provide power-saving benefits from precharging a common output (e.g., MTCH) node of the comparator 170. It should also be noted that in some embodiments, the counting circuitry 130 may be located in the row driver 60, or any suitable component, such that outputs from the counter 130 are transmitted to the sub-pixels 72.

As described above, the memory circuitry of the sub-pixel 72 operates to provide a pulse width emission scheme and permits light emission according to a gray level represented by the bits stored in the bit-stores 178. In the event that a bit-store 178 were to be defective after manufacturing, there may be no easy or convenient way to repair the individual bit-store 178 (e.g., direct replace the bit-store 178), hence why rerouting techniques are so desirable.

Figure 8A:
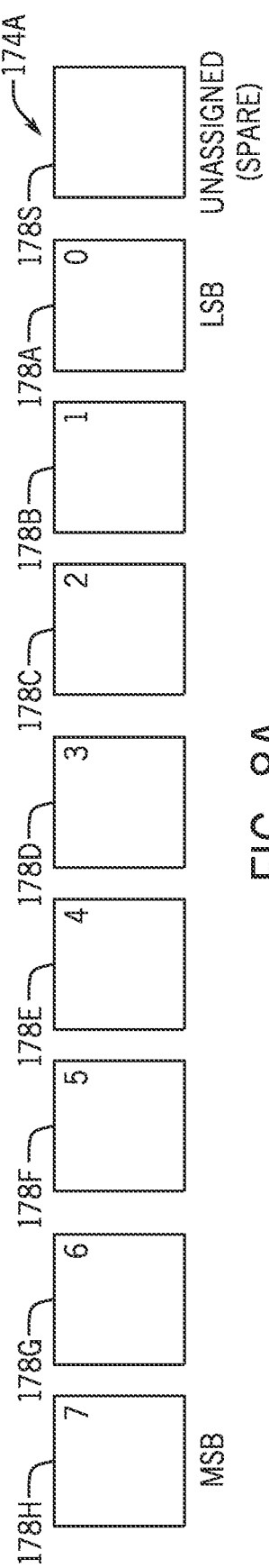
FIG. 8A is a diagrammatic representation of the memory circuitry of FIG. 6 including a spare bit-store, in accordance with an embodiment.
Figure 8B:
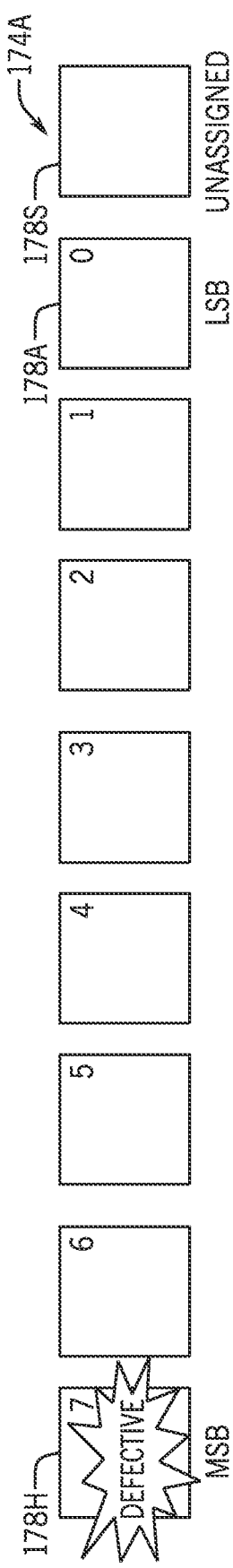
FIG. 8B is a diagrammatic representation of the memory circuitry of FIG. 6 having a defective bit-store, in accordance with an embodiment.
Figure 8C:
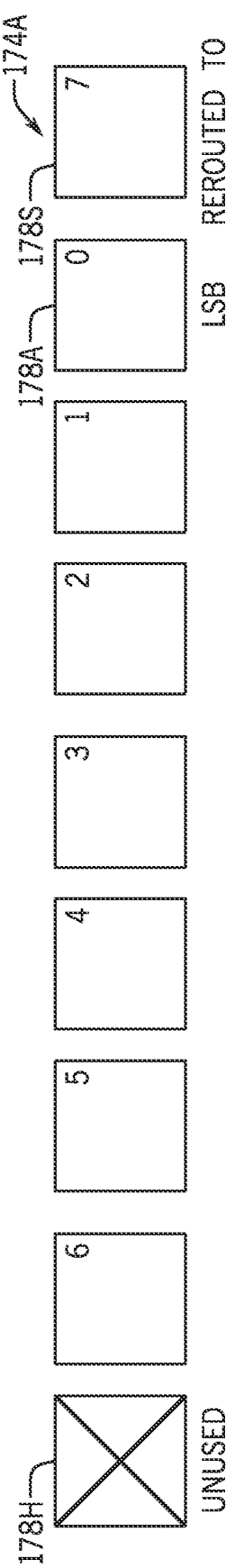
FIG. 8C is a diagrammatic representation of the memory circuitry of FIG. 6 implementing rerouting techniques to reroute data from the defective bit-store to the spare bit-store, in accordance with an embodiment.
Figure 10A:
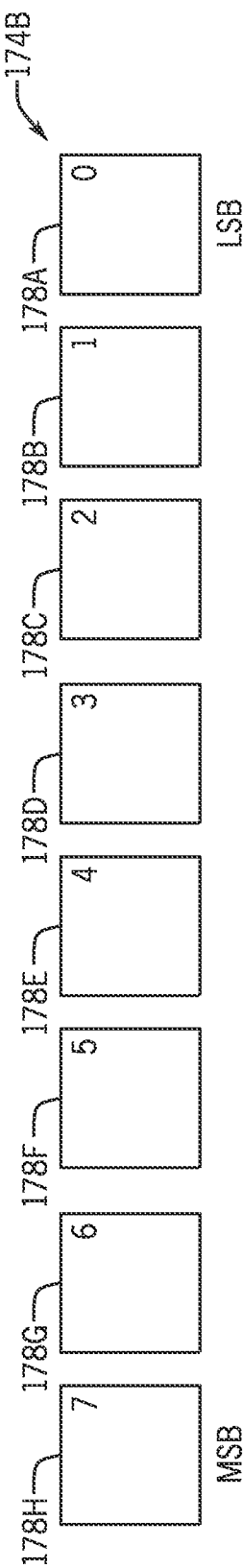
FIG. 10A is another diagrammatic representation of the memory circuitry of FIG. 6, in accordance with an embodiment.
Figure 10B:
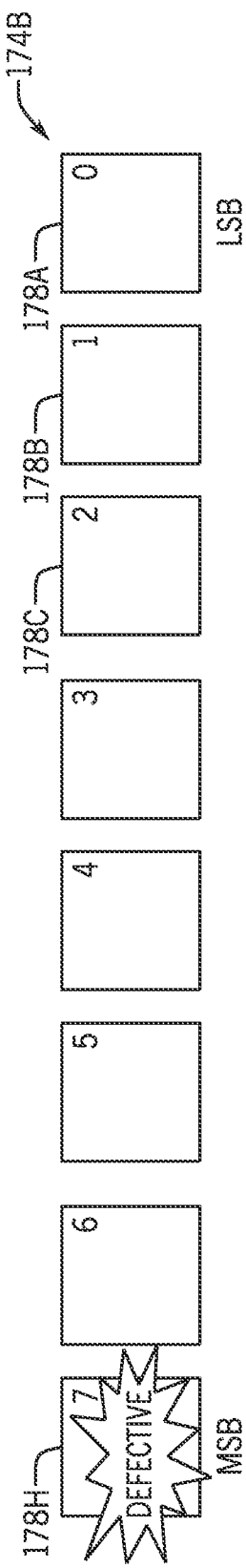
FIG. 10B is a diagrammatic representation of the memory circuitry of FIG. 6 having a defective bit-store, in accordance with an embodiment.
Figure 10C:
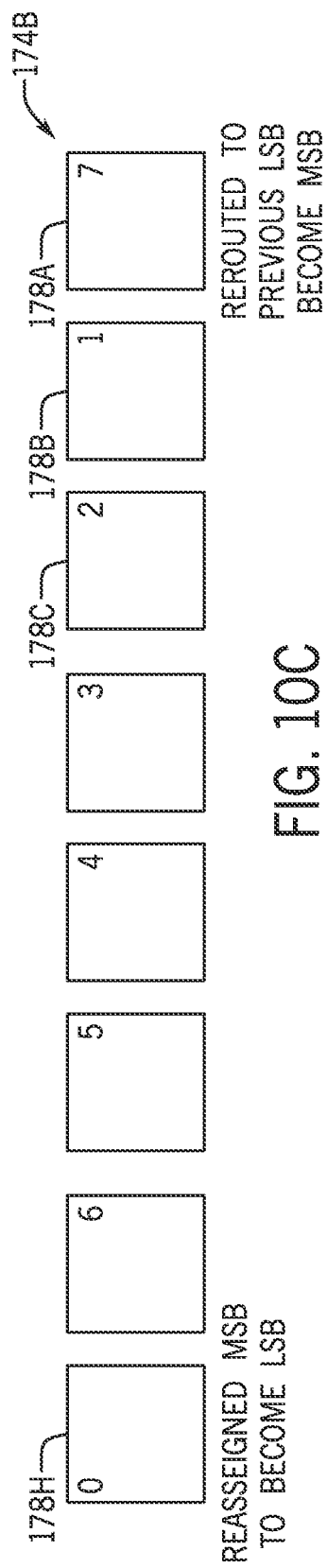
FIG. 10C is a diagrammatic representation of the memory circuitry of FIG. 6 implementing rerouting techniques to reroute data from the defective bit-store to an existing least significant bit, in accordance with an embodiment.
Figure 12A:
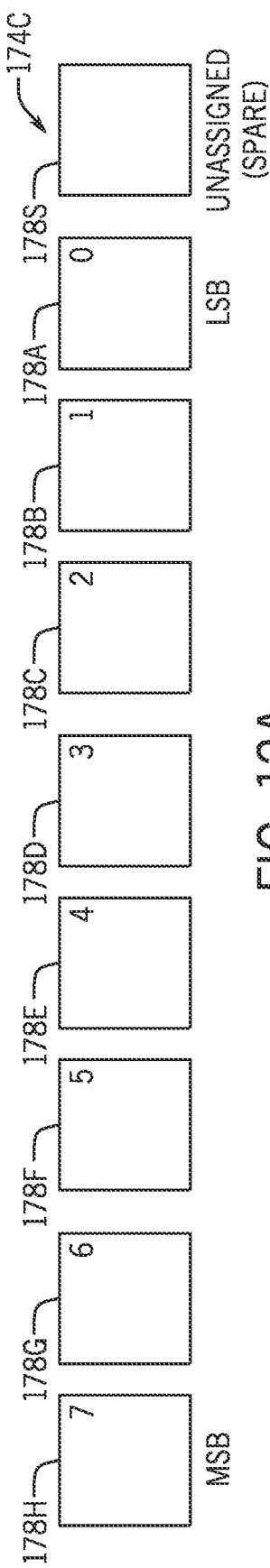
FIG. 12A is a third diagrammatic representation of the memory circuitry of FIG. 6 including the spare bit-store, in accordance with an embodiment.
Figure 12B:
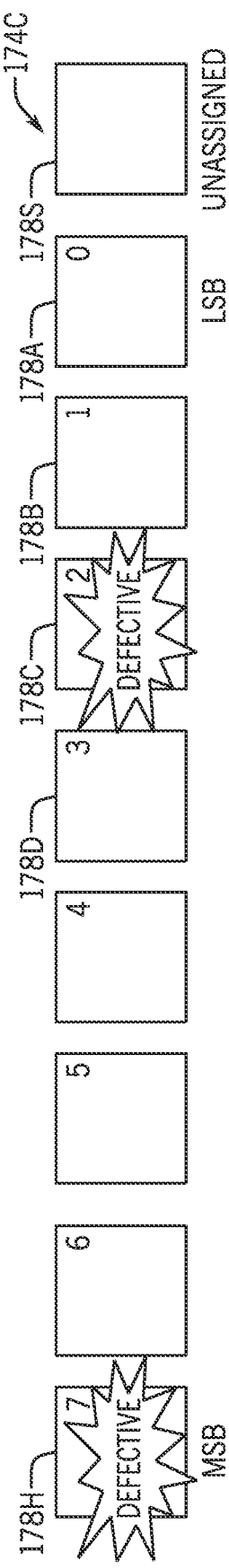
FIG. 12B is a diagrammatic representation of the memory circuitry of FIG. 6 having a first defective bit-store and a second defective bit-store, in accordance with an embodiment.
Figure 12C:
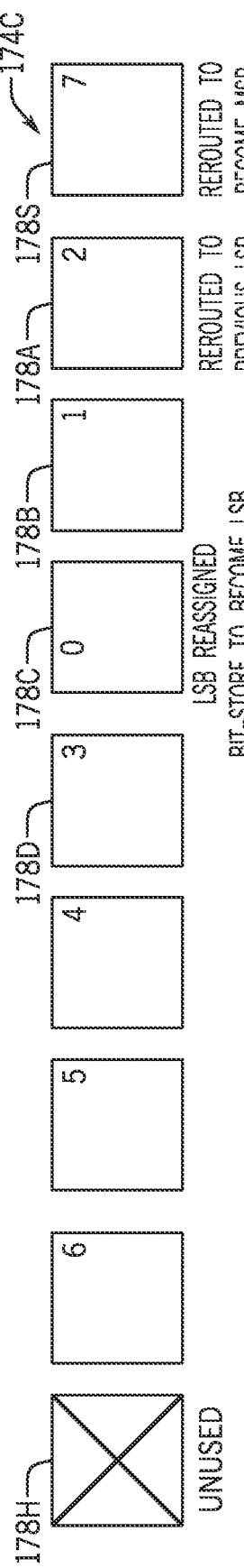
FIG. 12C is a diagrammatic representation of the memory circuitry of FIG. 6 implementing rerouting techniques to reroute data for the first defective bit-store to the spare bit-store and to reroute data for the second defective bit-store to the bit-store corresponding to a least significant bit, in accordance with an embodiment.

To help illustrate these rerouting techniques, FIGS. 8A-8C, FIGS. 10A-10C, and FIGS. 12A-12C each depict a diagrammatic representation of an example 8-bit memory having eight bit-stores 178. FIGS. 8A-8C depict how data transmitted to a defective bit-store 178 may be rerouted to a spare bit-store 178. FIGS. 10A-10C depict how data transmitted to a defective bit-store 178 may be rerouted to a bit-store 178 corresponding to a least significant bit (e.g., bit 0). In addition, FIGS. 12A-12C depict how two bits of data transmitted to defective bit-store 178 may be rerouted to a spare bit-store 178 and rerouted to a bit-store 178 corresponding to a least significant bit. These various sequences of figures show the flexibility in applying the rerouting techniques to the sub-pixel 72.

As described above, FIG. 8A is a diagrammatic representation of a first embodiment of the memory circuitry 172, memory circuitry 172A, including a spare bit-store 178S and additional bit-stores 178A-178H for storing the eight bits of image data transmitted to a sub-pixel 72. The bit-store 178A corresponds to a least significant bit (LSB) of the transmitted image data while the bit-store 178H corresponds to a most significant bit (MSB) of the transmitted image data. The spare bit-store 178S may be included in the memory circuitry 172 as a dedicated spare bit-store to be used in the event that a bit-store 178A-178H is found to be defective but is unused when each of the memory components of the memory circuitry 172A are operational. Thus, a spare bit-store 178S is independent of bit position associations corresponding to other memory components in the memory circuitry 172A because any data for any bit-store may be routed instead to the spare bit-store 178S.

FIG. 8B is a diagrammatic representation of the memory circuitry 172A having a defective bit-store 178H. In the event that a bit-store 178H is found to be defective, mapping may be used to reroute the bit to be transmitted to the defective bit-store 178H from the defective bit-store 178H to the spare bit-store 178S.

To illustrate the effect of the rerouting, FIG. 8C is a diagrammatic representation of the memory circuitry 172A implementing rerouting techniques to reroute data from the defective bit-store 178H to the spare bit-store 178S. In some embodiments, the most significant bit to be transmitted to the defective bit-store 178H is rerouted to be stored in the spare bit-store 178S. This rerouting may occur while maintain the routing for the other bits to the original bit-stores, such that bit-store 178A continues to receive the least significant bit (e.g., bit 0), bit-store 178B receives the second least significant bit (e.g., bit 1), and the like. After rerouting the bit to the spare bit-store 178S, the defective bit-store 178H becomes unused and is not routed to a bit associated with the image data. It should be understood that while the memory circuitry 172A is depicted as including eight bit-stores 178 and one unassigned spare bit-store 178S, any suitable number of bit-stores and any suitable number of spare bit-stores may be included in the memory circuitry 172 to provide the benefits of this disclosure.

Figure 9:
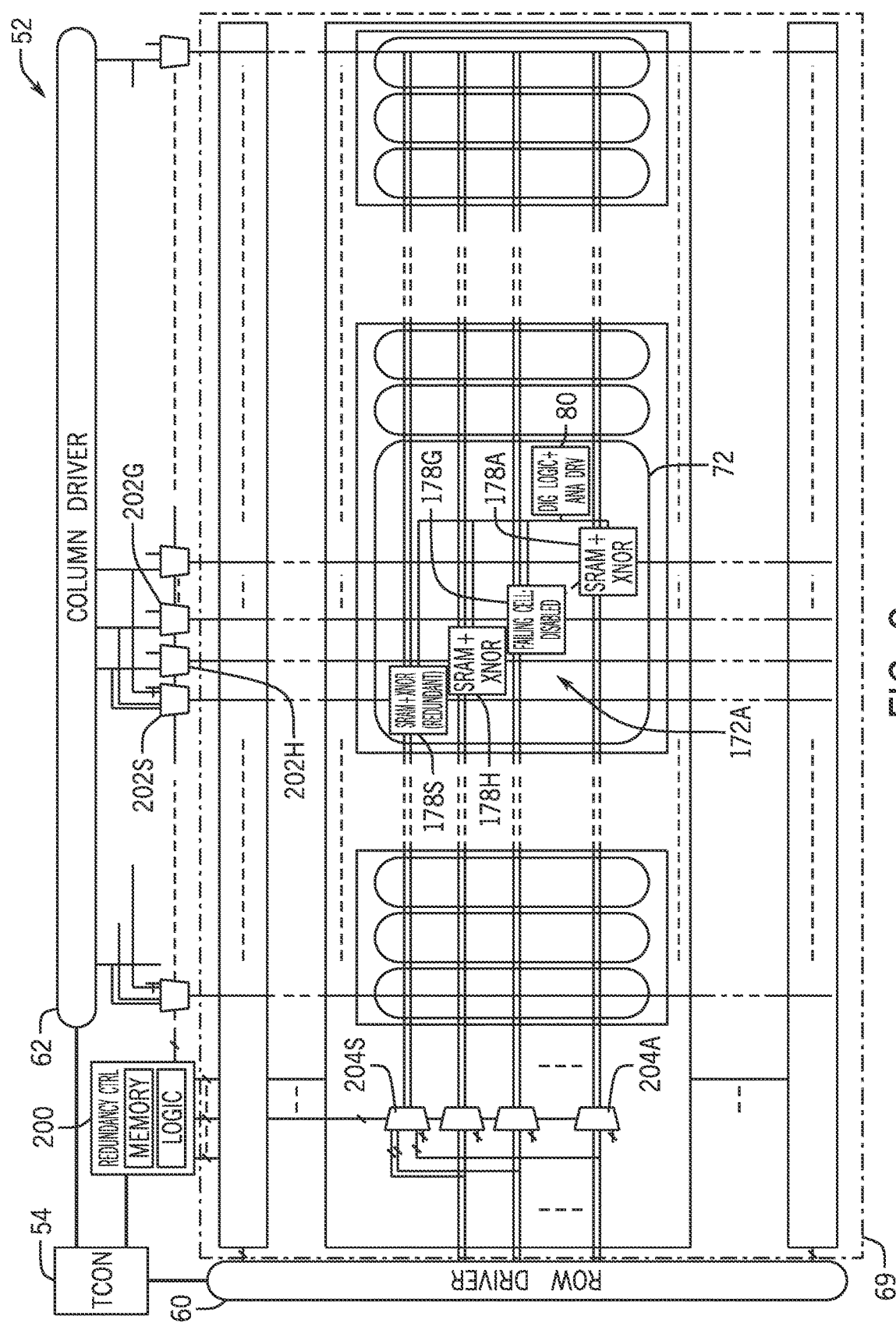
FIG. 9 is a block diagram of the diagrammatic representation of FIG. 8C associated with the first embodiment of the memory circuitry of FIG. 6, in accordance with an embodiment.

To help illustrate the rerouting operations described herein, FIG. 9 is a block diagram of a memory-in-pixel display system 52 that implements the memory circuitry 172A including the bit-stores 178A-H and the spare bit-store 178S. As depicted, the bit-store 178G is defective. In response to determining the bit-store 178G is defective, the timing controller 54 may operate to replace the defective bit-store 178G with the spare bit-store 178S by setting the counter 130 output for the defective bit-store 178B to zero (e.g., CNT[X]=0 and CNT_b[X]=0), effectively disabling the defective bit-store 178G. The counter 130 output for the defective bit-store 178G is disabled in addition to the data lines corresponding to the defective bit-store 178G. This disabling may also help to reduce power consumption of the display system 52 since the unused bit-store 178G is no longer consuming power or consuming negligible amounts of power. The redundancy control circuitry 200 may include memory and logic components to facilitate the row driver 60 and column driver 62 with managing the operational logic of the image data routing. In this way, the timing controller 54 may arbitrate routing or rerouting of image data from the defective bit-store 178G to the spare bit-store 178S via multiplexer 202S. The timing controller may also operate the row driver 60 to reroute the counter 130 output (CNT[X]) from the bit-store 178G to the spare bit-store 178S via the multiplexer 204S. The redundancy control circuitry 200 may selectively control the multiplexers 202 and the multiplexers 204. The row driver 60 and column driver 62 may operate and/or reroute bits based on control signals from the timing controller 54. Through communication with the redundancy control circuitry 200, the row driver 60, and the column driver 62, the timing controller 54 may reroute the defective bit-store 178G with the spare bit-store 178S based on a map of the defective bit-stores 178 of the display system 52. In some embodiments, the timing controller 54 may operate to replace additional defective bit-stores 178 with additional included spare bit-stores 178. The timing controller 54 may cause at least in part the output image data from the bit-stores 178 to driver 80 that uses internal digital logic and analog driving circuitry associated with the sub-pixel 72 to emit light from the LED 103 to facilitate present the image.

FIG. 10A is a diagrammatic representation of a second embodiment of the memory circuitry 172, memory circuitry 172B, that includes bit-stores 178A-178H used to store the eight bits of image data transmitted to a sub-pixel 72. The bit-store 178A corresponds to a least significant bit (LSB) of the transmitted image data while the bit-store 178H corresponds to a most significant bit (MSB) of the transmitted image data. The memory circuitry 172B does not include a spare bit-store 178S, and in this way, in the event that a bit-store 178A-178H is found to be defective, the bit for the defective bit store 178 is rerouted to the bit-store 178 corresponding to the least significant bit, in this example, bit-store 178A. This particular rerouting is useful since it does not introduce additional circuitry into the memory circuitry 172 and may correct defective bit-stores 178 in a similar manner as the spare bit-store 178S rerouting technique. To elaborate on the concept, the least significant bit may provide a smaller contribution to the overall light emitted from the sub-pixel 72 and thus may be replaced by a more significant bit that causes a larger contribution to the overall light emitted. For example, a first eight bit binary number "10011111" corresponds to a gray level of 159, while the binary number "10011110" corresponds to a gray level of 158 (created by changing the state of the least significant bit) and the binary number "00011111" corresponds to a gray level of 31 (created by changing the state of the most significant bit) showing that using the bit-store 178A corresponding to the least significant bit to replace a defective bit-store 178H corresponding to the most significant bit has less impact to the overall gray level than permitting the most significant bit to be unused in the final gray level used for light emission.

To help illustrate FIG. 10B is a diagrammatic representation of the memory circuitry 172B that include a defective bit-store 178H. In the event that a bit-store 178H is found to be defective (e.g., discovered after manufacturing but before shipment to a customer), mapping may be used to reroute the bit to be transmitted to the defective bit-store 178H from the defective bit-store 178H to the bit-store 178A corresponding to the least significant bit of the transmitted image data.

FIG. 10C is a diagrammatic representation of the memory circuitry 172B implementing rerouting techniques to reroute data from the defective bit-store 178H to the bit-store 178A for the least significant bit (e.g., bit 0). As is illustrated, the most significant bit (e.g., bit 7) to be transmitted to the defective bit-store 178H is rerouted to be stored in the bit-store 178A. This rerouting may occur while keeping the other bits routed (e.g., mapped) to the original bit-stores, such that bit-store 178B continues to receive the second least significant bit, bit-store 178C continues to receive the third bit, and the like. After rerouting the bit to the bit-store 178A, the defective bit-store 178H is rerouted the least significant bit (e.g., bit 0) instead of the most significant bit (e.g., bit 7). It should be understood that while the memory circuitry 172B is depicted as including eight bit-stores, any number of bit-stores may be included and any number of reroutings may be used in the memory circuitry 172 to provide the benefits of this disclosure.

Figure 11:
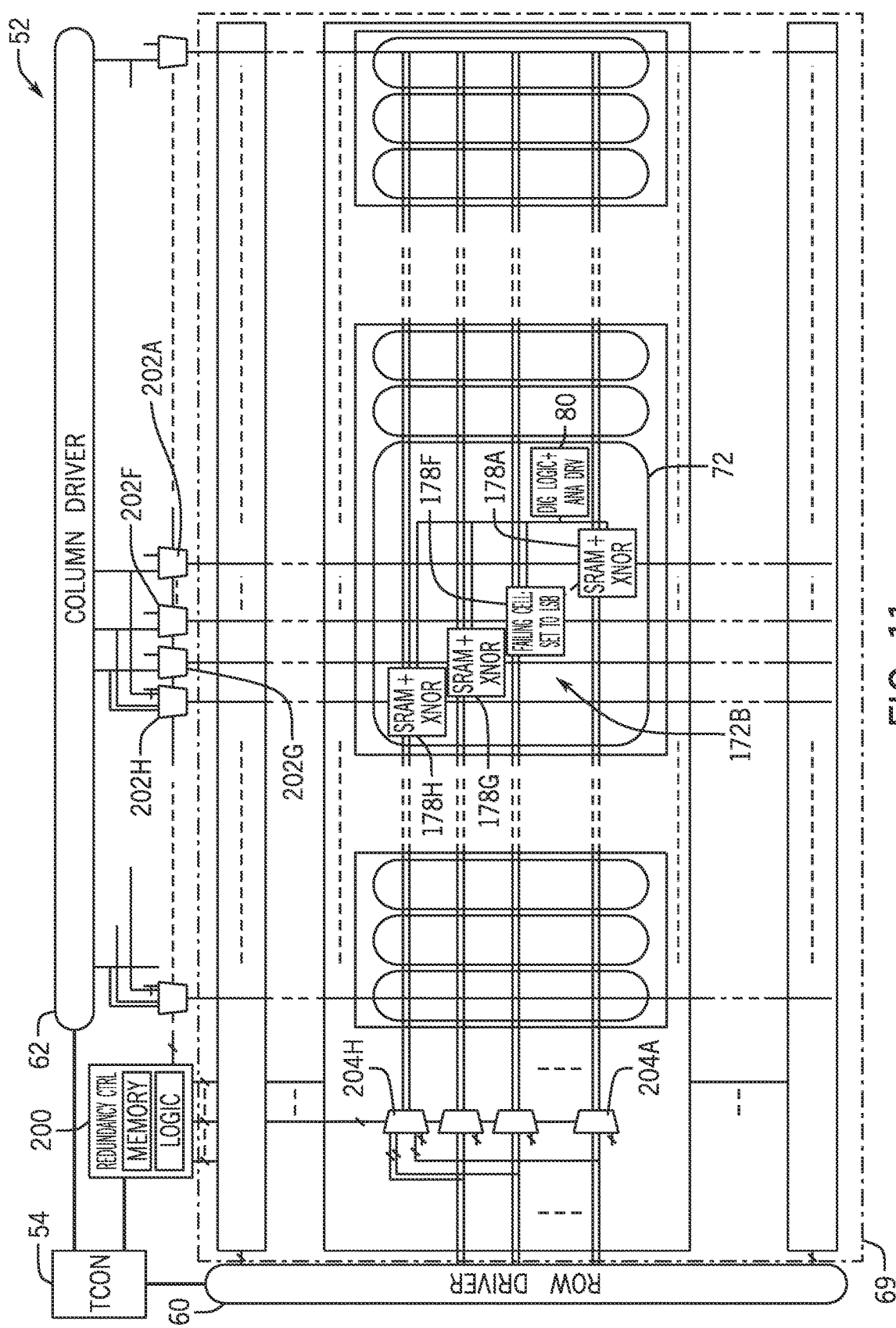
FIG. 11 is a block diagram of the diagrammatic representation of FIG. 10C associated with the memory circuitry of FIG. 6, in accordance with an embodiment.

To further illustrate, FIG. 11 is a block diagram of a memory-in-pixel display system 52 that implements the memory circuitry 172B including the bit-stores 178A-H. As depicted, the bit-store 178C is defective. In response to determining the bit-store 178F is defective, the timing controller 54 may arbitrate routing or rerouting of image data from the defective bit-store 178F to the least significant bit-store 178A via multiplexer 202A. As described above, the redundancy control circuitry 200 may include memory and logic components to facilitate the row driver 60 and column driver 62 with managing the operational logic of the image data routing, for example, by operating one or more of the multiplexers 202 and/or the multiplexers 204. In this way, the bit originally corresponding to the defective bit-store 178F is permitted to affect light emission while the least significant bit data originally corresponding to the bit-store 178A is not permitted to affect light emission (e.g., through being rerouted to a defective bit-store 178F).

To perform this LSB rerouting, the redundancy control circuitry 200 may selectively control the multiplexers 202 and the multiplexers 204. The row driver 60 and column driver 62 may reroute signals based on control signals received from the timing controller 54. Through communication with the redundancy control circuitry 200, the row driver 60, and the column driver 62, the timing controller 54 may reroute data for the defective bit-store 178F to the bit-store 178A based at least in part on a map of defective bit-stores 178 associated with the display system 52. In some embodiments, the timing controller 54 may operate to reroute bits corresponding to additional defective bit-stores 178 to other bit-stores 178 not already being used from rerouting. Thus, a timing controller 54 may perform the rerouting two, three, four, or more times based on the particular display system 52 embodiment. The timing controller 54 may operate the sub-pixel 72 to transmit the bits stored in the bit-stores 178 to the driver 80 to cause light emission from the LED 103 corresponding to an image to be displayed.

In some embodiments, spare bit-stores 178 and LSB rerouting techniques may be combined. To help illustrate, FIG. 12A is a diagrammatic representation of a third embodiment of the memory circuitry 172, memory circuitry 172C, that uses both a spare bit-store 178S and LSB rerouting techniques to correct for defective bit-stores 178. The memory circuitry 172C includes bit-stores 178A-178H used to store the eight bits of image data transmitted to a sub-pixel 72 and a spare bit-store 178S. The bit-store 178A corresponds to a least significant bit (LSB) of the transmitted image data while the bit-store 178H corresponds to a most significant bit (MSB) of the transmitted image data. In this embodiment, the most impactful defective bit-store 178H (e.g., the most significant bit position) on the gray level is replaced by the spare bit-store 178S and the bit corresponding to the second most impactful defective bit-store 178C is rerouted a bit-store 178A that corresponds to the least significant bit (or lesser significant bit). If additional defective bit-stores 178 exist, the LSB rerouting may be repeated to reroute each impactful bit into functional non-defective bit-stores 178. Through following this combined technique, perceivable impacts on displayed image quality caused by two or more defective bit-stores are minimized and/or eliminated.

FIG. 12B is a diagrammatic representation of the memory circuitry 174C having a first defective bit-store 178H and a second defective bit-store 178C. In the event that multiple bit-stores 178 are defective (e.g., discovered after manufacturing but before shipment to a customer), mapping may be used to reroute the bits to be transmitted to the defective bit-stores 178 from the defective bit-stores 178 to the bit-store 178A corresponding to the least significant bit of the transmitted image data and/or to a spare bit-store 178S. In this embodiment, one spare bit-store 178S is included, however, in some embodiments, multiple spare bit-stores 178S may be included. In addition, in this embodiment, one LSB rerouting is performed, however, as described above, multiple LSB reroutings may be performed—that is, a first and a second least significant bit may be used to correct for defective bit-stores 178C and 178H.

FIG. 12C is a diagrammatic representation of the memory circuitry 172C implementing rerouting techniques to reroute data for the first defective bit-store 178H to the spare bit-store 178S and to reroute data for the second defective bit-store 178C to the bit-store 178A corresponding to a least significant bit. This rerouting may occur while keeping the other bits routed to the original bit-stores 178, such that bit-store 178B continues to receive the second least significant bit, bit-store 178D continues to receive the fourth bit, and the like. After rerouting the first bit to the spare bit-store 178S and the second bit to the bit-store 178A, the defective bit-store 178H becomes unused and is not routed image data for display while the defective bit-store 178C is routed image data originally routed to the bit-store 178A. It should be understood that while the memory circuitry 172B is depicted as including eight bit-stores 178A-178H to store image data and a spare bit-store 178S, any number of bit-stores 178 may be included to provide the benefits of this disclosure.

Figure 13:
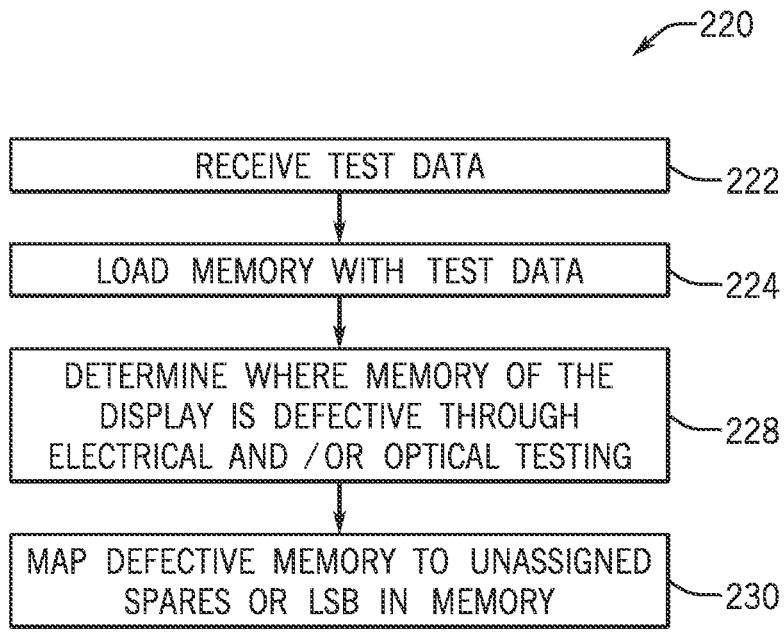
FIG. 13 is a flow chart for a method for generating a map of defective bit-stores for a memory-in-pixel electronic display, in accordance with an embodiment.

With the foregoing in mind, FIG. 13 is a flow chart for a method 220 for generating a map of defective bit-stores 178 for a memory-in-pixel electronic display. Although the following description of the method 220 is described as being performed by the timing controller 54, it should be understood that any suitable processing-type device may perform the method 220. Also, it should be understood that the method 220 may not be limited to being performed accordingly to the order depicted in FIG. 13; and instead may be performed in any suitable order.

Referring now to FIG. 13, at block 222, the timing controller 54 may receive test data. The test data may be used to facilitate an identification of memory components (e.g., bit-stores 178) that are defective. In this way, the test data may act as a control to compare (e.g., determine a difference between) measured performance of sub-pixels 72 to determine if the respective bit-stores 178 for the particular sub-pixels 72 are correctly operating.

After receiving the test data, at block 224, the timing controller 54 may load the memory circuitry 172 with the test data. To do this, the timing controller 54 may operate the column driver 62 to individually store bits corresponding to a gray level for the test data into each bit-store 178 such that the corresponding digital number represented by the bit-store 178 equals the gray level of the test data. The column driver 62 may operate each bit-store 178 to receive the test data bit through selective activation of the corresponding transistors 176.

If the light emitted by the sub-pixel 72 deviates from what the expected perceived gray level (e.g., known gray level transmitted as the test data), the timing controller 54 may correlate the deviation to one or more defective bit-stores 178. Thus, at block 228, the timing controller 54 may determine where memory of the display system 52 is defective through performing electrical or optical testing on the output generated in response to the test data. The timing controller 54 may determine the defective bit-stores 178 in a variety of ways including, but not limited to, receiving an indication from a user input defining which bit-stores 178 are defective, from measuring a quality or brightness of light emitted by the display system 52 while displaying the test data and determining the measured value deviates from an expected value associated with the test data (such as through optical testing involving one or more optical measurements, or optical-based measurements), performing electrical testing to determine which bit-stores 178 are defective, or the like.

Based on the defective bit-stores 178, at block 230, the timing controller 54 may generate a map indicative of the defective bit-stores 178 and subsequent reroutings to decrease or eliminate the impact of the defective bit-stores 178. In some embodiments, the timing controller 54 may work with additional processing circuitry, such as the processing core complex 12, to generate the map. This map may be interpretable by the row driver 60, the timing controller 54, the redundancy control circuitry 200, and/or the column driver 62 to facilitate in the rerouting and correction of the defective bit-stores 178.

Figure 14:
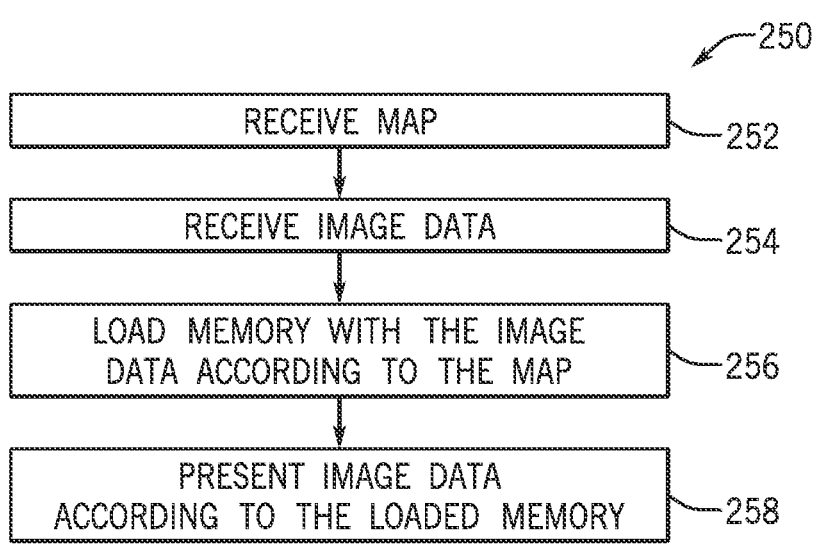
FIG. 14 is a flow chart for a method displaying an image via the memory-in-pixel electronic display according to the map of defective bit-stores, in accordance with an embodiment.

To help describe how the map is used in displaying image data, FIG. 14 is a flow chart for a method 250 for displaying an image via the memory-in-pixel electronic display system 52 according to the map. Although the following description of the method 250 is described as being performed by the timing controller 54, it should be understood that any suitable processing-type device may perform the method 250. Also, it should be understood that the method 250 may not be limited to being performed accordingly to the order depicted in FIG. 14; and instead may be performed in any suitable order.

Referring now to FIG. 14, at block 252, the timing controller 54 may receive the map. As described above, the map may be externally generated by the processing core complex 12, or otherwise transmitted to the timing controller 54. In addition, the timing controller 54 may access the map from a memory location, such as a storage device 14.

After receiving the map, at block 254, the timing controller 54 may receive the image data. The timing controller 54 may receive the image data from a variety of sources, including processing circuitry dedicated to retrieving, preparing, and transmitting of individual frames of image data for display. In addition, the timing controller 54 may operate to retrieve the image data itself from a suitable memory location, such as a storage device 14.

After the timing controller 54 receives the image data, at block 256, the timing controller 54 may load the memory circuitry 172 with the image data according to the map. That is, the timing controller 54 may read the map to receive the reroutings that are to occur to correct for defective bit-stores 178. Based on reading the map, the timing controller 54 loads the bit-stores 178 according to the mappings that reroute defective bit-stores to mapped bit-stores with the correct image data. In this way, the defective bit-stores 178 are unused (the exception being when a least significant bit is rerouted intentionally into a defective bit-store 178) and the spare bit-stores 178 are leveraged to lessen the impact one or more defective bit-store 178 has on perceived image quality and perceived gray levels.

The timing controller 54, at block 258, may operate to present the image data according to the loaded memory circuitry 172, after loading the various bit-stores 178 according to the map. As described above, the timing controller 54 operates to present an image through operating the sub-pixel 72 to emit light for a particular duration of time corresponding to the image data loaded into the bit-stores 178 of that sub-pixel 72. Thus, through loading the memory circuitry 172 according to the map indicative of the defective bit-stores 178 and rerouting data to reduce the impact of the defective bit-stores 178, the timing controller 54 is able to continue to operate a display system 52 even while the display system 52 has defective memory in one or more sub-pixels 72.

In some embodiments, these techniques are applied over groups of pixels, such as over one or more rows of pixels. For example, instead of each sub-pixel having a dedicated spare bit-store 178S, four rows of pixels might share one or more of the bit-stores 178. In these embodiments, the display system 52 may support differing data handling schemes, where image data is loaded for emission at different times, permitting the sharing of the bit-stores 178.

In addition, in some embodiments, in generation of the map, the timing controller 54 or other suitable processing circuitry may take into consideration secondary factors to determine which defective bit-store 178 to replace with the spare bit-store 178. For example, the timing controller 54 may determine a location of the pixel on the screen or which sub-pixel the particular defective bit-store 178 is affecting to prioritize the repair. In this way, a defective bit-store 178 that affects a pixel in the middle of a screen may have replacement prioritized over a defective bit-store 178 that affects a pixel on the side of a screen. As another example, certain channels of sub-pixels 72 may be prioritized, such as repairs to affected red sub-pixels 72 may be prioritized over blue sub-pixels 72.

Thus, the technical effects of the present disclosure include improvements to controllers of electronic displays to compensate for non-uniform pixel properties caused by defective memory of a memory-in-pixel display system, for example, through generating a map corresponding to defective memories that shows reroutings from the defective memory to different memory to compensate for the defective memories. These techniques describe rerouting data from defective bit-stores to functional, non-defective bit-stores based on how significant of a bit the defective bit-store is associated with. These techniques describe an improved manner to detect and correct defective bit-stores, enabling the continued use of a memory-in-pixel display system even when defective bit-stores are included in memory circuitry. In addition, memory-in-pixel electronic displays may implement memory cells distributed across pixels of the electronic displays where it may not be feasible or possible to use standard redundancy schemes.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
   a pixel circuit comprising:
      a plurality of memory components; and
      a light-emitting device configured to emit light based on a data value representative of a portion of an image frame to be depicted via the pixel circuit; and
   processing circuitry configured to:
      transmit one or more write control signals to the pixel circuit to cause the pixel circuit to store each bit of a plurality of bits of a data value in the plurality of memory components based on a mapping between the plurality of bits and the plurality of memory components, wherein the mapping corresponds to a routing of one or more of the plurality of bits associated with one or more defective memory components of the plurality of memory components to one or more other memory components of the plurality of memory components.

2. The electronic device of claim 1, wherein the processing circuitry is configured to disable the one or more defective memory components based on the mapping.

3. The electronic device of claim 2, wherein the processing circuitry is configured to disable the one or more defective memory components by setting a counter output associated with the one or more defective memory components to zero.

4. The electronic device of claim 1, wherein the processing circuitry is configured to transmit the one or more write control signals to the pixel circuit in accordance with a time-multiplexed scheme.

5. The electronic device of claim 4, wherein the time-multiplexed scheme is determined based on the mapping.

6. The electronic device of claim 1, wherein the one or more other memory components correspond to memory components that are unused before the transmission of the one or more write control signals.

7. The electronic device of claim 1, wherein the pixel circuit is configured to:
compare the plurality of bits of the data value stored in the plurality of memory components based on the mapping to a sequence of bits generated by a counter; and
send a signal to a switch configured to couple the light-emitting device to a voltage source in response to the plurality of bits of the data value stored in the plurality of memory components based on the mapping matching the sequence of bits generated by the counter.

8. The electronic device of claim 1, wherein the processing circuitry comprises:
a plurality of multiplexers;
a column driver configured to couple to a first subset of the plurality of multiplexers; and
a row driver configured to couple to a second subset of the plurality of multiplexers, wherein the first subset and the second subset of the plurality of multiplexers are configured to cause the pixel circuit to store each bit of the plurality of bits of the data value in the plurality of memory components based on the mapping between the plurality of bits and the plurality of memory components.

9. The electronic device of claim 8, wherein each of the first subset and the second subset of the plurality of multiplexers comprises more than one multiplexer.

10. The electronic device of claim 1, wherein the mapping corresponds to routing one bit of the plurality of bits associated with one of the one or more defective memory components to one of the one or more other memory components that corresponds to a least significant bit associated with the plurality of memory components.

11. A display device comprising:
a pixel comprising:
a plurality of memory components; and
a light-emitting device configured to emit light based on a data value representative of a portion of an image frame to be depicted via the pixel;
a plurality of multiplexers;
a column driver configured to couple to a first subset of the plurality of multiplexers; and
a row driver configured to couple to a second subset of the plurality of multiplexers, wherein the first subset and the second subset of the plurality of multiplexers are configured to cause the pixel to store each bit of a plurality of bits of the data value in the plurality of memory components based on a mapping between the plurality of bits and the plurality of memory components, wherein the mapping corresponds to a routing of one or more of the plurality of bits associated with one or more defective memory components of the plurality of memory components to one or more other memory components of the plurality of memory components.

12. The display device of claim 11, comprising control circuitry configured to:
instruct the row driver to cause output of each bit of the plurality of bits from the plurality of memory components according to a time-multiplexed pattern determined based on the mapping.

13. The display device of claim 11, wherein control circuitry is configured to determine the mapping based at least in part on a first indication of the one or more defective memory components, a second indication of a location of the pixel within a pixel array, a third indication of a replacement priority associated with the one or more defective memory components, or any combination thereof.

14. The display device of claim 11, wherein the pixel comprises control circuitry configured to:
compare the plurality of bits of the data value stored in the plurality of memory components based on the mapping to a sequence of bits generated by a counter; and
send a signal to a switch configured to couple the light-emitting device to a voltage source in response to the plurality of bits of the data value stored in the plurality of memory components based on the mapping matching the sequence of bits generated by the counter.

15. The display device of claim 11, wherein each of the first subset and the second subset of the plurality of multiplexers comprises more than one multiplexer.

16. A method, comprising:
receiving, via a processor, a mapping corresponding to a routing of one or more of a plurality of bits of a data value to one or more memory components of a plurality of memory components, wherein the mapping is determined based on one or more defective memory components of the plurality of memory components; and
transmitting, via the processor, one or more write control signals to a pixel circuit to cause the pixel circuit to store each bit of the plurality of bits of the data value in the one or more memory components of the plurality of memory components based on the mapping.

17. The method of claim 16, wherein the one or more memory components correspond to spare memory components.

18. The method of claim 17, wherein the one or more write control signals are configured to cause the pixel circuit to reroute a bit of the plurality of bits from one of the one or more defective memory components of the plurality of memory components to one of the one or more memory components based on a position of one of the one or more defective memory components.

19. The method of claim 16, comprising disabling, via the processor, an output of a counter configured to enable access to the one or more defective memory components of the plurality of memory components based at least in part on the mapping.

20. The method of claim 19, wherein disabling the output of the counter comprises setting, via the processor, the output of the counter to a defined voltage value.

* * * * *